(12) United States Patent
Lee

(10) Patent No.: US 9,966,482 B2
(45) Date of Patent: May 8, 2018

(54) SOLAR CELL MODULE AND PREPARING METHOD OF THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 159 days.

(21) Appl. No.: 14/353,207

(22) PCT Filed: Jun. 15, 2012

(86) PCT No.: PCT/KR2012/004747
§ 371 (c)(1),
(2), (4) Date: Apr. 21, 2014

(87) PCT Pub. No.: WO2013/058459
PCT Pub. Date: Apr. 25, 2013

(65) Prior Publication Data
US 2014/0246089 A1    Sep. 4, 2014

(30) Foreign Application Priority Data

Oct. 19, 2011 (KR) ........................ 10-2011-0106785

(51) Int. Cl.
*H01L 31/0232* (2014.01)
*C09K 11/77* (2006.01)
(Continued)

(52) U.S. Cl.
CPC .... *H01L 31/02322* (2013.01); *C09K 11/7769* (2013.01); *H01L 31/046* (2014.12);
(Continued)

(58) Field of Classification Search
CPC ............. H01L 31/02322; H01L 31/055; H01L 31/0445–31/0468; Y02E 10/52; C09K 11/7769
(Continued)

(56) References Cited

U.S. PATENT DOCUMENTS

2008/0257399 A1 * 10/2008 Wong .................... H01L 31/043
136/246
2009/0095341 A1 * 4/2009 Pfenninger ........... H01L 31/048
136/246
(Continued)

FOREIGN PATENT DOCUMENTS

JP          08-204222     *  8/1996
KR    10-2009-0069894 A      7/2009
(Continued)

OTHER PUBLICATIONS

International Search Report in International Application No. PCT/KR2012/004747, filed Jun. 15, 2012.
(Continued)

*Primary Examiner* — Liesl C Baumann
(74) *Attorney, Agent, or Firm* — Saliwanichik, Lloyd & Eisenschenk

(57) ABSTRACT

A solar cell module according to the embodiment includes a back electrode layer formed on a top surface of a support substrate and including a first groove; a light absorbing layer formed on the back electrode layer and including a third groove; a front electrode layer formed on the light absorbing layer and including the third groove; and a wavelength conversion material formed in at least one of the first and third grooves.

9 Claims, 2 Drawing Sheets

(51) Int. Cl.
    *H01L 31/055* (2014.01)
    *H01L 31/046* (2014.01)
    *H01L 31/0465* (2014.01)

(52) U.S. Cl.
    CPC ........ *H01L 31/0465* (2014.12); *H01L 31/055* (2013.01); *Y02E 10/52* (2013.01)

(58) Field of Classification Search
    USPC .................................................. 136/243–265
    See application file for complete search history.

(56)           References Cited

U.S. PATENT DOCUMENTS

2010/0012183 A1    1/2010  Yeh
2011/0126889 A1*   6/2011  Bourke, Jr. ........... H01L 31/055
                                                          136/253
2011/0180134 A1    7/2011  Kim et al.
2012/0132277 A1*   5/2012  Sulima ................. H01L 31/055
                                                          136/257
2012/0260984 A1    10/2012 Han

FOREIGN PATENT DOCUMENTS

KR      10-2011-0047716 A       5/2011
KR      10-2011-0074062 A       6/2011
KR      10-2011-0086267 A       7/2011
TW         201005972 A          2/2010

OTHER PUBLICATIONS

Office Action dated Oct. 9, 2015 in Chinese Application No. 201280063098.4.

* cited by examiner

[Fig. 1]
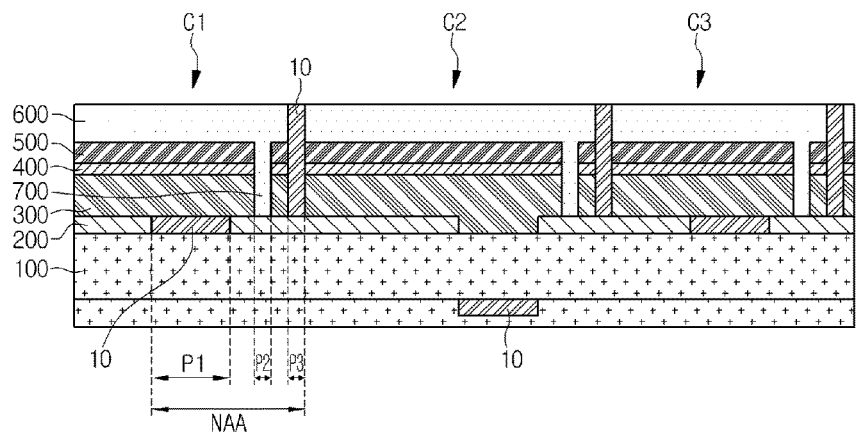
[Fig. 2]
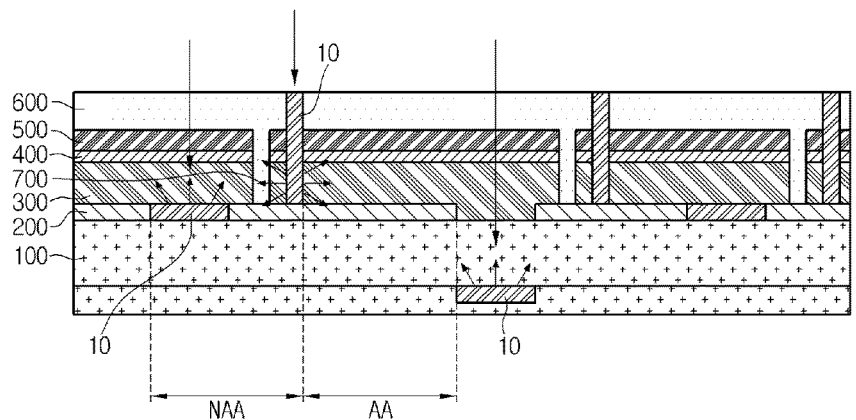
[Fig. 3]
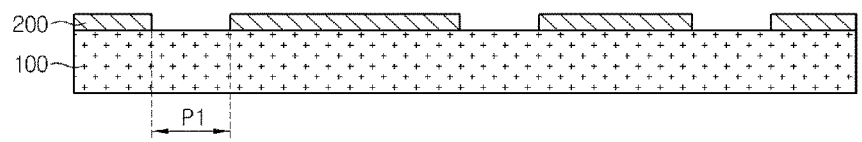
[Fig. 4]
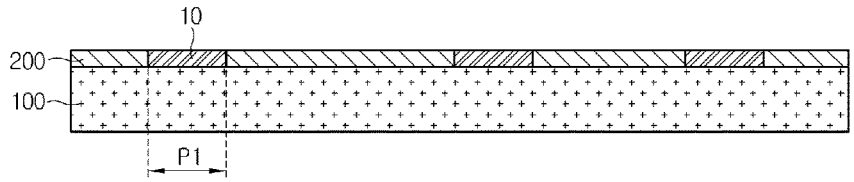
[Fig. 5]
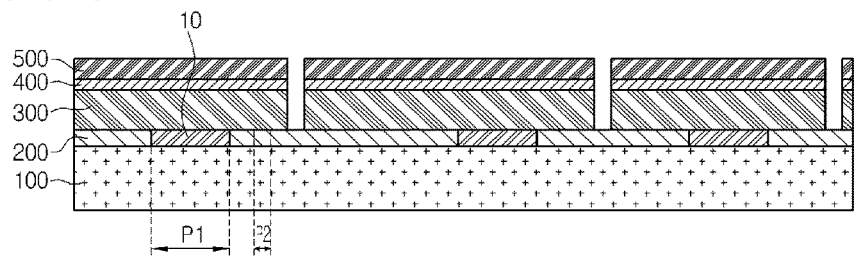

[Fig. 6]
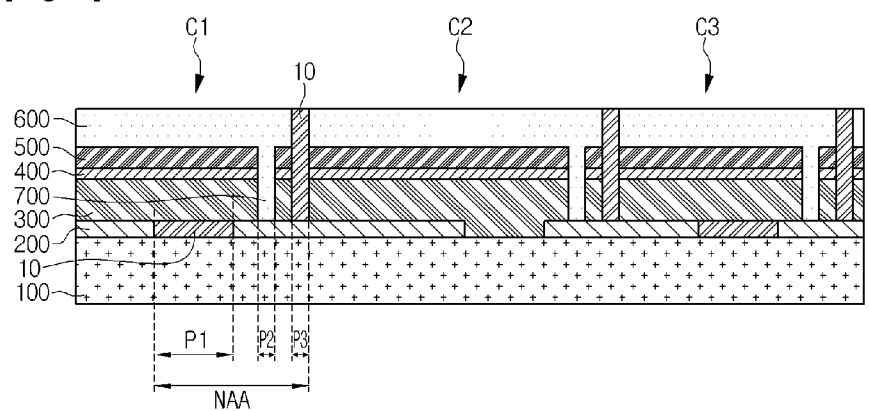

SOLAR CELL MODULE AND PREPARING METHOD OF THE SAME

CROSS-REFERENCE TO RELATED APPLICATIONS

This application is the U.S. national stage application of International Patent Application No. PCT/KR2012/004747, filed Jun. 15, 2012, which claims priority to Korean Application No. 10-2011-0106785, filed Oct. 19, 2011, the disclosures of each of which are incorporated herein by reference in their entirety.

TECHNICAL FIELD

The embodiment relates to a solar cell module including a wavelength conversion material and a preparing method of the same.

BACKGROUND ART

Solar cells may be defined as devices to convert light energy into electrical energy by using a photovoltaic effect of generating electrons when light is incident onto a P—N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

In general, a CIGS solar cell can be prepared by sequentially forming a back electrode layer, a light absorbing layer, a buffer layer and a front electrode layer on a glass substrate. The substrate can be prepared by using various materials, such as soda lime glass, stainless steel and polyimide (PI). The back electrode layer mainly includes molybdenum (Mo) having low specific resistance and thermal expansion coefficient similar to that of the glass substrate.

The light absorbing layer is a P type semiconductor layer and mainly includes $CuInSe_2$ or $Cu(In_xGa1-x)Se_2$, which is obtained by replacing a part of In with Ga. The light absorbing layer can be formed through various processes, such as an evaporation process, a sputtering process, a selenization process or an electroplating process.

The buffer layer is disposed between the light absorbing layer and the front electrode layer, which represent great difference in lattice coefficient and energy bandgap, to form a superior junction therebetween. The buffer layer mainly includes cadmium sulfide prepared through chemical bath deposition (CBD).

The front electrode layer is an N type semiconductor layer and forms a PN junction with respect to the light absorbing layer together with the buffer layer. In addition, since the front electrode layer serves as a transparent electrode at a front surface of the solar cell, the front electrode layer mainly includes aluminum-doped zinc oxide (AZO) having the superior light transmittance and electric conductivity.

In general, the light absorbing layer selectively absorbs light having the wavelength of about 500 nm to about 1200 nm. In particular, the light having the long wavelength exceeding 1200 nm may transmit through the light absorbing layer without being absorbed in the light absorbing layer. Thus, the CIGS solar cell according to the related art may use only the light having the wavelength of about 500 nm to about 1200 nm.

DISCLOSURE OF INVENTION

Technical Problem

The embodiment provides a solar cell module capable of using light having a long wavelength by converting the light having the long wavelength and a preparing method of the same.

Solution to Problem

A solar cell module according to the embodiment includes a back electrode layer formed on a top surface of a support substrate and including a first groove; a light absorbing layer formed on the back electrode layer and including a third groove; a front electrode layer formed on the light absorbing layer and including the third groove; and a wavelength conversion material formed in at least one of the first and third grooves.

A method of preparing a solar cell module according to the embodiment includes the steps of forming a back electrode layer including a first groove on a top surface of a support substrate; forming a light conversion material in the first groove; forming a light absorbing layer on the wavelength conversion material and the back electrode layer; and forming a front electrode layer on the light absorbing layer.

Advantageous Effects of Invention

The solar cell module according to the embodiment can convert light having the long wavelength, which cannot be absorbed in the light absorbing layer, into light having the short wavelength, which can be absorbed in the light absorbing layer, by using the wavelength conversion material. Thus, the light absorbing layer may absorb a greater amount of light. Therefore, the photoelectric conversion efficiency of the solar cell module according to the embodiment can be improved.

In addition, the wavelength conversion material can be formed in a non-active area (NAA) of the solar cell module. Thus, the solar cell module according to the embodiment may reduce and effectively use the non-active area, so the photoelectric conversion efficiency of the solar cell module according to the embodiment can be improved.

Further, the wavelength conversion material can convert not only the wavelength of the light, but also the light route. Thus, the light incident into the non-active area of the solar cell module can be output toward the active area by the wavelength conversion material. Therefore, the photoelectric conversion efficiency of the solar cell module according to the embodiment can be improved.

BRIEF DESCRIPTION OF DRAWINGS

FIG. 1 is a sectional view showing a solar cell module according to the embodiment;

FIG. 2 is a sectional view showing a route and a wavelength of light converted by a wavelength conversion material according to the embodiment; and FIGS. 3 to 6 are sectional views showing a preparing method of a solar cell module according to the embodiment.

MODE FOR THE INVENTION

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

As defined in this specification, the term "meta-material" represents a composite material, which is formed by mixing or arranging at least two heterogeneous materials under the micro-level, such as the angstrom level or the nanometer level. The meta-material may adjust the electromagnetic characteristics of the composite material and can be determined according to the effective dielectric constant (or relative dielectric constant) and the effective relative magnetic permeability.

FIG. 1 is a sectional view showing a solar cell module according to the embodiment.

Referring to FIG. 1, a solar cell according to the embodiment includes a wavelength conversion material 10, a support substrate 100, a back electrode layer 200, a light absorbing layer 300, a buffer layer 400, a high-resistance buffer layer 500, and a front electrode layer 600.

The support substrate 100 has a plate shape and supports the back electrode layer 200, the light absorbing layer 300, the buffer layer 400, the high-resistance buffer layer 500 and the front electrode layer 600. The support substrate 100 may be transparent, and may be rigid or flexible.

In addition, the support substrate 100 may include an insulator. For example, the support substrate 100 may include a glass substrate, a plastic substrate, or a metallic substrate. In more detail, the support substrate 100 may include a soda lime glass substrate. In addition, the support substrate 100 may include a ceramic substrate including alumina, stainless steel, or polymer having a flexible property.

The back electrode layer 200 is provided on the support substrate 100. The back electrode layer 200 is a conductive layer. The back electrode layer 200 may include one selected from the group consisting of molybdenum (Mo), gold (Au), aluminum (Al), chrome (Cr), tungsten (W), and copper (Cu). Among the above materials, the Mo has a thermal expansion coefficient similar to that of the support substrate 100, so the Mo may improve the adhesive property and prevent the back electrode layer 200 from being delaminated from the substrate 100.

The back electrode layer 200 includes a first groove P1. The back electrode layer 200 can be patterned by the first groove P1. In addition, the first groove P1 can be variously arranged in the form of a stripe as shown in FIG. 2 or a matrix.

The light absorbing layer 300 is provided on the back electrode layer 200. The light absorbing layer 300 includes a group I-III-VI compound. For example, the light absorbing layer 300 may have the CIGSS (Cu(IN,Ga)(Se,S)$_2$) crystal structure, the CISS (Cu(IN)(Se,S)$_2$) crystal structure or the CGSS (Cu(Ga)(Se,S)$_2$) crystal structure.

The buffer layer 400 is provided on the light absorbing layer 300. The buffer layer 400 may include CdS, ZnS, InXSY or InXSeYZn(O, OH). The buffer layer 400 may have the thickness in the range of about 50 nm to about 150 nm and the energy bandgap in the range of about 2.2 eV to about 2.4 eV.

The high-resistance buffer layer 500 is disposed on the buffer layer 400. The high-resistance buffer layer 500 includes i-ZnO, which is not doped with impurities. The high-resistance buffer layer 500 may have the energy bandgap in the range of about 3.1 eV to about 3.3 eV. The high-resistance buffer layer 500 can be omitted.

The front electrode layer 600 may be provided on the light absorbing layer 300. For example, the front electrode layer 600 may directly make contact with the high-resistance buffer layer 500 formed on the light absorbing layer 300.

The front electrode layer 600 may include a transparent conductive material. In addition, the front electrode layer 600 may have the characteristics of an N type semiconductor. In this case, the front electrode layer 600 forms an N type semiconductor with the buffer layer 400 to make a PN junction with the light absorbing layer 300 serving as a P type semiconductor layer. For instance, the front electrode layer 600 may include aluminum-doped zinc oxide (AZO). The front electrode layer 600 may have a thickness in the range of about 100 nm to about 500 nm.

The front electrode layer 600 includes a third groove P3. In detail, the buffer layer 400, the high-resistance buffer layer 500 and the front electrode layer 600 are separated from each other by the third groove P3 and the cells C1, C2, C3 ... and Cn are separated from each other by the third groove P3.

The solar cell module according to the embodiment includes the wavelength conversion material 10. The wavelength conversion material 10 receives light having a first wavelength and converts the light having the first wavelength into light having a second wavelength. In detail, the first wavelength may be a long wavelength and the second wavelength may be a short wavelength. For instance, the first wavelength exceeds 1200 nm, and the second wavelength is in the range of about 500 nm to about 1200 nm.

As described above, the light absorbing layer of the solar cell selectively absorbs the light having the wavelength in the range of about 500 nm to about 1200 nm. If the light has the long wavelength exceeding 1200 nm, the light transmits without being absorbed in the light absorbing layer, so the solar cell may not use the light having the long wavelength. In order to solve the above problem, according to the embodiment, the light having the long wavelength is converted into the light having the wavelength, which can be absorbed in the light absorbing layer 300, by using the wavelength conversion material 10.

The wavelength conversion material 10 is formed in at least one of the first and third grooves. In addition, the wavelength conversion material 10 can be additionally formed at the bottom surface of the support substrate 100. Referring to FIG. 1, the wavelength conversion material 10 is disposed in the first and third grooves and on the bottom surface of the support substrate 100, but the embodiment is not limited thereto.

The first and third grooves are formed in the non-active area NAA. The term "non-active area" used in this specification refers to the region where the light incident into the solar cell module is not converted into electric energy. That is, according to the solar cell module of the embodiment, the wavelength conversion material is formed in the non-active area, so the non-active area may be reduced and effectively used. Thus, the solar cell module according to the embodiment can improve the photoelectric conversion efficiency.

As shown in FIG. 1, at least one first groove P1 and at least one third groove P3 can be provided. If a plurality of first and third grooves P1 and P3 are provided, the wavelength conversion material 10 can be formed in all or a part of the first grooves P1 and the third grooves P3.

In addition, the wavelength conversion material 10 can be formed on a predetermined region of the bottom surface of the support substrate 100. For instance, the wavelength conversion material 10 can be formed on the bottom surface of the support substrate 100 corresponding to the first groove P1. In detail, the first groove P1 may not include the wavelength conversion material 10. The wavelength conversion material 10 disposed on the bottom surface of the support substrate 100 can convert the wavelength of the light passing through the first groove where the wavelength conversion material 10 is not formed, but the embodiment is not limited thereto.

The wavelength conversion material 10 according to the embodiment can convert not only the wavelength of the light, but also the light route. Referring to FIG. 2, the light having the wavelength converted by the wavelength conversion material 10 can be output in all directions. In detail, the solar light having the long wavelength, which is incident into the non-active area NAA, is converted into the light having the short wavelength by the wavelength conversion material 10 and the light route is also changed, so that the light can be incident into the active area AA. Thus, a greater amount of the light can be incident into the active area AA, so that the solar cell module according to the embodiment can improve the photoelectric conversion efficiency by the wavelength conversion material 10.

The wavelength conversion material may include a rare-earth oxide phosphor. The rare-earth oxide phosphor may further include a rare-earth oxide and a rare-earth metal doped in the rare-earth oxide. The rare-earth oxide may include an oxide of Y, Dy, Sm, Gd, La, Ho, Eu, Tm, Er, Ce, Tb, Pr, Yb, Nd, or Lu. In addition, the rare-earth metal doped in the rare-earth oxide may include one selected from the group consisting of Y, Dy, Sm, Gd, La, Ho, Eu, Tm, Er, Ce, Tb, Pr, Yb, Nd, Lu and a combination thereof. For instance, the wavelength conversion material may include a phosphor expressed as $Y_2O_3$:Eu, but the embodiment is not limited thereto. Meanwhile, the rare-earth oxide may be doped with Al in addition to the above rare-earth metals, but the embodiment is not limited thereto.

In addition, the wavelength conversion material may include a meta-material. As defined in this specification, the term "meta-material" represents a composite material, which is formed by mixing or arranging at least two heterogeneous materials under the micro-level, such as the angstrom level or the nanometer level. The meta-material may adjust the electromagnetic characteristics of the composite material and can be determined according to the effective dielectric constant (or relative dielectric constant) and the effective relative magnetic permeability.

FIGS. 3 to 6 are sectional views showing the preparing method of the solar cell module according to the embodiment. The above description about the solar cell module will be incorporated herein by reference.

Referring to FIG. 3, the back electrode layer 200 is formed on the support substrate 100. The back electrode layer 200 may be formed through a PVD (Physical Vapor Deposition) scheme or a plating scheme.

The back electrode layer 100 includes the first groove P1. That is, the back electrode layer 200 is patterned by the first groove P1. The first groove P1 may have various shapes, such as a stripe shape shown in FIG. 3 or a matrix shape. For instance, the width of the first pattern P1 may be in the range of about 80 μm to about 200 μm, but the embodiment is not limited thereto.

Referring to FIG. 4, the wavelength conversion material 10 is formed in the first groove P1. According to one embodiment, the wavelength conversion material 10 may include $Y_2O_3$:Eu. For instance, the wavelength conversion material 10 may be prepared in the form of $Y_2O_3$ nanoparticle doped with Eu by performing the solvothermal synthesis for about 1 hour to about 5 hours at the temperature of about 200° C. by using ethylene amine as a solvent and then performing the heat treatment process for about 2 hours to about 4 hours at the temperature of about 1000° C. to about 14,000° C. in the atmosphere.

Referring to FIG. 5, the light absorbing layer 300, the buffer layer 400, the high-resistance buffer layer 500 and the front electrode layer 600 are formed on the back electrode layer 200 and the second groove P2 is formed.

The light absorbing layer 300 may be formed through various schemes such as a scheme of forming a Cu(In,Ga)$Se_2$ (CIGS) based light absorbing layer 300 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, or a Ga target. Thereafter, the metallic precursor layer is subject to the selenization process so that the Cu(In,Ga)Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Thereafter, the buffer layer 400 may be formed by depositing CdS on the light absorbing layer 300 through a CBD (Chemical Bath Deposition) scheme. In addition, ZnO is deposited on the buffering layer 400 through the sputtering process, thereby forming the high-resistance buffer layer 500.

Referring to FIG. 5, the second groove P2 is formed in the light absorbing layer 300, the buffer layer 400, and the high-resistance buffer layer 500. The second groove P2 can be formed through the mechanical scheme and the back electrode layer 20 is partially exposed through the second groove P2. The second groove P2 is formed through the light absorbing layer 300. The second groove P2 is a open region for exposing the top surface of the back electrode layer 200. The second groove P2 has the width in the range of about 80 μm to about 200 μm, but the embodiment is not limited thereto.

Then, as shown in FIG. 6, a transparent conductive material is laminated on the high-resistance buffer layer 500 to form the front electrode layer 600 serving as a second electrode and a connection wire 700. When the transparent conductive material is laminated on the high-resistance buffer layer 500, the transparent conductive material is filled in the second groove P2, so that the connection wire 700 is formed. The connection wire 700 electrically connects the back electrode layer 200 with the front electrode layer 600.

The front electrode layer 600 is a window layer that forms the PN junction together with the light absorbing layer 300. Since the front electrode layer 600 serves as a transparent electrode at the front surface of the solar cell, the front electrode layer 600 may include ZnO having the superior light transmittance and electric conductivity.

An electrode having a low resistance value can be formed by doping zinc oxide (ZnO) with aluminum (Al). For instance, the front electrode layer 600 can be formed through the RF sputtering scheme using a ZnO target, the reactive sputtering scheme using a Zn target, and the metal organic vapor deposition process.

In addition, as shown in FIG. 6, the third groove P3 is formed through the light absorbing layer, the buffer layer 400, the high-resistance buffer layer 500 and the front electrode layer 600. The unit cells C1, C2, C3 . . . and Cn can be separated from each other by the third groove P3 and the unit cells C1, C2, C3 . . . and Cn can be connected with each other by the connection wire 700. The third groove P3 can be formed through the mechanical scheme or the laser irradiation such that the top surface of the back electrode pattern 200 can be exposed through the third groove P3.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   a support substrate;
   a plurality of solar cells disposed on a top surface of the support substrate; and
   a wavelength conversion material,
   wherein each solar cell of the plurality of solar cells comprises:
      a back electrode layer on a top surface of the support substrate;
      a first groove extending through the back electrode layer;
      a light absorbing layer on the back electrode layer; and
      a front electrode layer on the light absorbing layer;
   wherein each first groove has a first edge and a second edge opposed to the first edge,
   wherein each first edge and each second edge directly contact the back, electrode layer,
   wherein each of the solar cells of the plurality of solar cells is separated from each other by a third groove,
   wherein each first groove and each third groove is formed in a non-active area,
   wherein the plurality of solar cells includes a first solar cell, a second solar cell, and a third solar cell;
   wherein the second solar cell is disposed between the first solar cell and the third solar cell,
   wherein the first groove of the first solar cell, the first groove of the third solar cell, and each of the third grooves are filled with the wavelength conversion material;
   wherein the first groove of the second solar cell is filled with the light absorbing layer,
   wherein the wavelength conversion material is further directly disposed on a bottom surface of the support substrate only at a portion aligned with the first groove of the second solar cell,
   wherein the wavelength conversion material that is directly disposed on the bottom surface of the support substrate has a third edge and a fourth edge opposed to the third edge, and
   wherein the third edge is aligned with the first edge of the first groove of the second solar cell, and the fourth edge is aligned with the second edge of the first groove of the second solar cell.

2. The solar cell module of claim 1, wherein the wavelength conversion material includes a rare-earth oxide phosphor.

3. The solar cell module of claim 2, wherein the rare-earth oxide phosphor comprises:
   a rare-earth oxide including Y, Dy, Sm, Gd, La, Ho, Eu, Tm, Er, Ce, Tb, Pr, Yb, Nd, or Lu; and
   a rare-earth metal doped in the rare-earth oxide.

4. The solar cell module of claim 3, wherein the rare-earth oxide phosphor is expressed as following chemical formula of $Y_2O_3$:Eu.

5. The solar cell module of claim 1, wherein the wavelength conversion material includes a meta-material.

6. The solar cell module of claim 1, wherein the wavelength conversion material receives a first light having a first wavelength exceeding 1200 nm and outputs a second light having a second wavelength in a range of from 500 nm to 1200 nm.

7. The solar cell module of claim 1, wherein the wavelength conversion material converts a light route.

8. The solar cell module of claim 1, wherein the light absorbing layer further includes a second groove.

9. The solar cell module of claim 1, wherein the light absorbing layer has a CIGSS ($Cu(In,Ga)(Se,S)_2$) crystal structure, a CISS ($Cu(In)(Se,S)_2$) crystal structure, or a CUSS ($Cu(Ga)(Se,S)_2$) crystal structure.

* * * * *